(12) United States Patent
Semond et al.

(10) Patent No.: US 10,361,077 B2
(45) Date of Patent: Jul. 23, 2019

(54) METHOD FOR PRODUCING A PASSIVATED SEMICONDUCTOR STRUCTURE BASED ON GROUP III NITRIDES, AND ONE SUCH STRUCTURE

(71) Applicant: CENTRE NATIONAL DE LA RECHERCHE SCIENTIFIQUE (CNRS), Paris (FR)

(72) Inventors: Fabrice Semond, Cannes (FR); Eric Frayssinet, Mouans Sartoux (FR); Jean Massies, Valbonne (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 15/545,289

(22) PCT Filed: Jan. 21, 2016

(86) PCT No.: PCT/FR2016/050124
§ 371 (c)(1),
(2) Date: Jul. 20, 2017

(87) PCT Pub. No.: WO2016/116713
PCT Pub. Date: Jul. 28, 2016

(65) Prior Publication Data
US 2018/0012753 A1    Jan. 11, 2018

(30) Foreign Application Priority Data

Jan. 21, 2015  (FR) ..................................... 15 50461

(51) Int. Cl.
*H01L 21/02*    (2006.01)
*H01L 29/04*    (2006.01)
(Continued)

(52) U.S. Cl.
CPC .... *H01L 21/0254* (2013.01); *H01L 21/02381* (2013.01); *H01L 21/02433* (2013.01);
(Continued)

(58) Field of Classification Search
CPC ............... H01L 21/0254; H01L 29/205; H01L 21/02381; H01L 29/2003; H01L 29/045;
(Continued)

(56) References Cited

U.S. PATENT DOCUMENTS

2002/0069816 A1* 6/2002 Gehrke .................... C30B 25/02
117/84
2002/0110172 A1* 8/2002 Hasnain .................... H01S 5/10
372/45.01

(Continued)

FOREIGN PATENT DOCUMENTS

DE    10151092    5/2003
WO    WO-2007133603    11/2007

OTHER PUBLICATIONS

Derluyn J et al; Journal of Applied Physics; vol. 98, No. 5, pp. 054501-1-054501-5; Sep. 2, 2005; XP012078530 (JAP98).*
(Continued)

*Primary Examiner* — Charles D Garber
*Assistant Examiner* — S M Sohel Imtiaz
(74) *Attorney, Agent, or Firm* — Womble Bond Dickinson (US) LLP (57) ABSTRACT

The invention relates to a method for producing a semiconductor structure, characterized in that the method comprises a step (201) of depositing a crystalline passivation layer continuously covering the entire surface of a layer based on group III nitrides, said crystalline passivation layer, which is deposited from a precursor containing silicon atoms and a flow of nitrogen atoms, consisting of silicon atoms bound to the surface of the layer based on group III nitrides and
(Continued)

arranged in a periodical arrangement such that a diffraction image of said crystalline passivation layer obtained by grazing-incidence diffraction of electrons in the direction [1-100] comprises:
  two fractional order diffraction lines (0, −⅓) and (0, −⅔) between the central line (0, 0) and the integer order line (0, −1), and
  two fractional order diffraction lines (0, ⅓) and (0, ⅔) between the central line (0, 0) and the integer order line (0, 1).

9 Claims, 4 Drawing Sheets

(51) Int. Cl.
  *H01L 29/20* (2006.01)
  *H01L 29/205* (2006.01)
(52) U.S. Cl.
  CPC .. *H01L 21/02458* (2013.01); *H01L 21/02664* (2013.01); *H01L 29/045* (2013.01); *H01L 29/2003* (2013.01); *H01L 29/205* (2013.01); *H01L 21/0262* (2013.01); *H01L 21/02631* (2013.01)
(58) Field of Classification Search
  CPC ......... H01L 21/02458; H01L 21/02631; H01L 21/0262
  See application file for complete search history.

(56) References Cited

U.S. PATENT DOCUMENTS

| | | | | |
|---|---|---|---|---|
| 2006/0240584 | A1* | 10/2006 | Fudeta | B82Y 20/00 438/22 |
| 2007/0138506 | A1* | 6/2007 | Braddock | H01L 21/28264 257/192 |
| 2009/0200635 | A1* | 8/2009 | Koldiaev | H01L 21/3081 257/506 |
| 2016/0005918 | A1* | 1/2016 | Nataf | H01L 21/0254 257/13 |

OTHER PUBLICATIONS

CNRS, "French Preliminary Search Report," FR Application No. 1550461 (dated Nov. 25, 2015) (with English translation cover sheet).

CNRS, "International Search Report," PCT Application No. PCT/FR2016/050124 (dated Apr. 6, 2016) (with English translation cover sheet).

Derluyn, J., et al., "Improvement of AlGaN/GaN high electron mobility transistor structures by in situ deposition of a $Si_3N_4$ surface layer," Journal of Applied Physics, vol. 98, No. 5, 5 pages (2005).

Lebedev, V., et al., "The role of Si as surfactant and donor in molecular-beam epitaxy of AlN," Journal of Applied Physics, vol. 98, No. 9, 6 pages (2005).

Markurt, T., et al., "Blocking growth by an electrically active subsurface layer: The effect of Si as an Antisurfactant in the growth of GaN," Physical Review Letters, vol. 110, 5 pages (Jan. 18, 2013).

Sakai, S., et al., A new method of reducing dislocation density in GaN layer grown on sapphire substrate by MOVPE,: Journal of Crystal Growth, vol. 221, pp. 334-337 (2000).

Shen, X., et al., "The formation of GaN dots on $Al_xGa_{1-x}N$ surfaces using Si in gas-source molecular beam epitaxy," Appl. Phys. Lett., vol. 72, No. 3, pp. 344-346 (Jan. 19, 1998).

Tanaka, S., et al., "Anti-Surfactant in III-Nitride Epitaxy," Jpn. J. Appl. Phys., vol. 39, Pt. 2, No. 8B, pp. L831-L834 (2000).

Yun, F., et al., "Efficacy of single and double SiNx interlayers on defect reduction in GaN overlayers grown by organometallic vapor-phase epitaxy," Journal of Applied Physics, vol. 98, 8 pages (2005).

* cited by examiner

METHOD FOR PRODUCING A PASSIVATED SEMICONDUCTOR STRUCTURE BASED ON GROUP III NITRIDES, AND ONE SUCH STRUCTURE

FIELD OF THE INVENTION

The invention relates to a method for producing a semiconductor structure based on group III nitrides, and one such semiconductor structure.

PRESENTATION OF THE PRIOR ART

Semiconductor materials based on group III nitrides of the periodic table—such as materials based on gallium nitride GaN—occupy an increasingly important place in the electronics and optoelectronics fields, notably for the production of light emitting diodes.

Existing methods for producing a semiconductor structure based on group III nitrides, such as gallium nitride GaN, on a substrate, for example made of silicon or sapphire, generally result in an important threading dislocation density linked to the difference in lattice parameter between the host substrate and semiconductor materials based on group III nitrides. These threading dislocations are particularly disadvantageous in the case of semiconductor structures forming light emitting devices based on semiconductor materials of group III nitrides since threading dislocations increase leakage currents and deteriorate the luminescence output of these light emitting devices.

Three dimensional epitaxy techniques—such as ELO (epitaxial lateral overgrowth), pendeo-epitaxy from nanopillars, the addition of antisurfactant species, the modification of the growth conditions—have proven their efficiency in reducing the threading dislocation density in semiconductor materials based on group III nitrides.

The approach used by these techniques for reducing the threading dislocation density consists of initiating a mode of three-dimensional growth (by islands), then favouring the coalescence of the islands to obtain a two-dimensional gallium nitride GaN layer.

A popular in-situ technique for reducing the threading dislocation density consists of inserting an intercalary silicon nitride SiNx layer below the GaN layer. More precisely, a silicon nitride SiNx layer is deposited in-situ on a group III nitride layer, then a gallium nitride GaN layer is deposited on the silicon nitride SiNx layer. This technique has proven its efficiency in reducing the threading dislocation density for conventional c-plane GaN but also for semi non-polar orientations.

It is known that a surface treatment based on silicon and ammonia leads to the formation of a nanoporous silicon nitride SiNx layer which acts as a nano-mask making it possible to initiate a three-dimensional mode of growth of GaN. The growth of GaN is inhibited in the regions where the silicon nitride SiNx is located. On the other hand the growth takes place in the nano-pores, that is to say in the openings of the nano-mask. The density and the size of the latter are controlled by the deposition time of the silicon nitride SiNx and their distribution on the surface is random.

For example, the following documents deal with these subjects:
The article entitled "A New Method of Reducing Dislocation Density in GaN Layer Grown on Sapphire Substrate by MOVPE" by Sakai et al., J. Cryst. Growth, 221, 334 (2000), The article entitled "Anti-Surfactant in III-Nitride Epitaxy—Quantum Dot Formation and Dislocation Termination" by S. Tanaka et al., Jap. J. Appl. Phys., 39, L83 1 (2000),
The article "Efficacy of single and double $SiN_x$ interlayers on defect reduction in GaN overlayers grown by organometallic vapor-phase epitaxy", by F. Yun et al., J. Appl. Phys., 98, 123502 (2005),
The patent application DE10151092 A1,
The patent application WO2007/133603 A2.

It has recently been shown that this type of treatment could also lead to the formation of a crystalline structure noted $3^{1/2} \times 3^{1/2}$ R30°, notably in the article "Blocking Growth by Electrically Active Subsurface Layer: The Effects of Si as an Antisurfactant in the Growth of GaN", by T. Markurt et al. Physical Review Letters 110, 036103 (2013). In this article, the crystalline layer is produced in such a way as to obtain a partially covered surface, with more or less large uncovered regions that are called "openings" and this layer is designated "nanoporous".

During the step of deposition of the gallium nitride GaN layer, the epitaxied gallium nitride grows preferentially in the openings of the nanoporous layer so as to form islands. Once the islands have been formed, the growth parameters are adjusted so that the gallium nitride GaN develops laterally so as to cover the zones covered with SiNx, and coalesces in order to form a gallium nitride GaN layer (3D growth). The growth of the gallium nitride layer is next continued until a desired thickness of gallium nitride GaN is obtained (2D growth). The coalescence thickness of the gallium nitride GaN is defined as the thickness required to obtain a GaN layer entirely coalesced after the insertion of the SiNx layer.

The reader will have understood that the increase in the duration of the surface treatment, and thus of the quantity of SiNx deposited, has the effect of increasing the coverage level of the SiNx layer and thus decreasing the density of gallium nitride GaN islands, which makes it possible to reduce the threading dislocation density. On the other hand, the lower the density of gallium nitride GaN islands, the greater the thickness of gallium nitride GaN required to obtain coalescence. It is thus particularly advantageous to determine the optimum coverage level of the SiNx layer in order to make such a method exploitable industrially.

In addition, existing methods for producing devices based on GaN on a substrate generally comprise a first step of deposition of a buffer layer, which may be for example aluminium nitride AlN for a silicon substrate potentially followed by a step of deposition of an aluminium and gallium nitride AlGaN layer on the aluminium nitride AlN buffer layer. The nano-mask may next be deposited on the AlN or AlGaN layer. Other methods provide for using a sapphire substrate and depositing a GaN layer at low temperature as buffer layer, wherein case the nano-mask is deposited on the GaN buffer layer.

A drawback of the mentioned growth technique with the nano-mask of SiNx relates to the fact that oxidation reactions may take place at the surface of the buffer layer not covered by the SiNx layer. Notably, the buffer layer can oxidise at the level of the openings in the case of exposure to air of the support constituted of the substrate, the buffer layer and the SiNx layer. Consequently, in the methods of the prior art, the upper (or final) gallium nitride GaN layer is formed on the SiNx layer immediately after the formation thereof, without possibility of storage of the support prior to the deposition of a gallium nitride layer thereon.

Another drawback of this technique relates to the fact that no means exist for making it possible to define the optimal duration of the step of deposition of the nanoporous SiNx layer. This optimal duration, linked to the size of the openings and the density thereof, varies as a function of the starting substrate used for growth, the type of reactor used for the growth, and other parameters such as the concentrations of precursor gases, etc. The size of the openings and the density thereof are non-measurable quantities, thus the determination of the optimal duration of the step of deposition of the nanoporous SiNx layer may thus only be obtained in an empirical manner by carrying out successive tests, which have to be reiterated each time that one of the growth parameters (i.e. substrate, reactor, etc.) is modified, which is time consuming and especially does not make it possible to carry out a generic method, that is to say applicable in a general manner.

An aim of the present invention is to propose a method making it possible to overcome at least one of the aforementioned drawbacks

SUMMARY OF THE INVENTION

In this respect, the invention proposes a method for producing a passivated semiconductor structure forming support for a structure based on group III nitrides, wherein the method comprises:
- a step of deposition of a crystalline passivation layer continuously covering the entire surface of a layer based on group III nitrides of the semiconductor structure, said crystalline passivation layer being deposited from a precursor containing silicon and nitrogen atoms, and said crystalline passivation layer being constituted of silicon and nitrogen atoms bound to the surface of the layer based on group III nitrides and arranged in a periodical arrangement such that a diffraction image of said crystalline passivation layer obtained by grazing-incidence diffraction of electrons in the direction [1-100] comprises:
- a central line (0, 0) and integer order lines (0, −1) and (0, 1),
- two fractional order diffraction lines (0, −⅓) and (0, −⅔) between the central line (0, 0) and the integer order line (0, −1), and
- two fractional order diffraction lines (0, ⅓) and (0, ⅔) between the central line (0, 0) and the integer order line (0, 1);
- the interruption of the deposition and obtaining the passivated semiconductor structure forming support for a structure based on group III nitrides.

The fact of depositing a crystalline layer that covers the entire surface of a layer based on group III nitrides of the semiconductor structure makes it possible to passivate totally the surface of this layer based on group III nitrides and thus to prevent any oxidation reaction of the latter. This enables the storage of the semiconductor structure covered with the crystalline passivation layer prior to the deposition of additional layers of the semiconductor structure based on group III nitrides.

Furthermore, the deposition of the crystalline layer that covers the entire surface makes it possible to do without the empirical phases of development and optimisation of methods of the prior art based on a step of deposition of a nanoporous SiNx layer, notably the determination of the optimum size of the nanopores as well as of the optimum density of the nanopores.

The step of deposition of a crystalline passivation layer based on silicon moreover enables a later growth of a crystalline layer thereon, for example a layer based on group III nitride, whereas an amorphous nanoporous layer covering the layer based on group III nitride would not enable this later growth. The described diffraction image corresponds to a hexagonal periodical arrangement turned by 30° with respect to the lattice of the layer based on group III nitride and of lattice parameter $\sqrt{3}$ times greater than the lattice parameter of the lattice of the layer based on group III nitride, which makes it possible to favour this later growth of a crystalline layer.

It will be understood hereafter that when a layer A is mentioned as being on a layer B, said layer may be directly on the layer B, or may be situated above the layer B and separated from said layer B by one or more intermediate layers.

It will also be understood that when a layer A is mentioned as being on a layer B, said layer may cover the whole surface of the layer B, or a portion of said layer B.

Preferred but non-limiting aspects of the device according to the invention are the following:
- the crystalline passivation layer is in epitaxial relation with the layer based on group III nitrides;
- a diffraction image of said crystalline passivation layer obtained by grazing-incidence diffraction of electrons in the direction [1-210] comprises a central line (0, 0) and integer order lines (0, −1) and (0, 1) without fractional order lines between them;
- said crystalline passivation layer consisting of atoms bound to the surface of the layer based on group III nitrides and arranged in a hexagonal periodical arrangement turned by 30° with respect to the lattice of the group III nitride layer and with a lattice parameter V greater than the lattice parameter of the lattice of the layer based on group III nitride;
- the step of deposition of the crystalline passivation layer consists of an ultra-vacuum deposition;
- the step of deposition of the crystalline passivation layer consists of a deposition by molecular beam epitaxy;
- the method comprises a step of measuring the coverage level of the crystalline passivation layer by grazing-incidence diffraction of electrons in the crystallographic direction [1-100] during the step of deposition of the crystalline passivation layer so as to obtain a diffraction image of said crystalline passivation layer, wherein the duration of the step of deposition of the crystalline passivation layer is a function of the intensity of at least one fractional order diffraction line of this diffraction image of the crystalline passivation layer obtained by electron diffraction in the direction [1-100];
- the diffraction image of the crystalline layer comprises in the direction [1-100]:
- a central line (0, 0) and integer order lines (0, −1) and (0, 1),
- two fractional order diffraction lines (0, −⅓) and (0, −⅔) between the central line (0, 0) and the integer order line (0, −1), and
- two fractional order diffraction lines (0, ⅓) and (0, ⅔) between the central line (0, 0) and the integer order line (0, 1),
- the step of deposition of the crystalline passivation layer being interrupted when the luminous intensity of said fractional order lines is maximal;
- the step of deposition of the crystalline passivation layer consists of a vapour phase deposition;

the step of deposition of the crystalline passivation layer consists of a deposition by metal organic vapour phase epitaxy;

the crystalline passivation layer has a thickness less than 6 Å;

the method comprises a step of formation on a substrate of a buffer layer, said buffer layer comprising the layer based on group III nitrides on which is deposited the crystalline passivation layer;

the buffer layer has, at the end of its formation, a thickness comprised between 10 and 200 nm;

the substrate is based on silicon and the step of formation of the buffer layer includes the deposition of an aluminium nitride AlN layer;

the step of formation of the buffer layer includes the deposition of a gallium and aluminium nitride AlGaN layer on the aluminium nitride layer.

The invention also relates to a passivated semiconductor structure forming support for a structure based on group III nitrides, said semiconductor structure comprising a layer based on group III nitrides of which the entire surface is entirely covered by a crystalline passivation layer comprising silicon and nitrogen atoms bound to the surface and arranged in a periodical arrangement such that a diffraction image of said crystalline passivation layer obtained by grazing-incidence diffraction of electrons in the direction [1-100] comprises:

a central line (0, 0) and integer order lines (0, −1) and (0, 1), two fractional order diffraction lines (0, −⅓) and (0, −⅔) between the central line (0, 0) and the integer order line (0, −1), and two fractional order diffraction lines (0, ⅓) and (0, ⅔) between the central line (0, 0) and the integer order line (0, 1).

Preferred but non-limiting aspects of the structure according to the invention are the following:

the crystalline passivation layer is in epitaxial relation with the layer based on group III nitrides;

a diffraction image of said crystalline passivation layer obtained by grazing-incidence diffraction of electrons in the direction [1-210] comprises a central line (0, 0) and integer order lines (0, −1) and (0, 1) without fractional order lines between them;

said crystalline passivation layer consisting of atoms bound to the surface of the layer based on group III nitrides and arranged in a hexagonal periodical arrangement turned by 30° with respect to the lattice of the layer based on group III nitride and with a lattice parameter V greater than the lattice parameter of the lattice of the layer based on group III nitride;

the crystalline passivation layer has a thickness less than 6 Å;

the layer based on group III nitrides is a self-supporting layer;

the structure comprises a substrate and a buffer layer on the substrate, the buffer layer constituting the layer based on group III nitrides of which the entire surface is continuously covered by a crystalline passivation layer;

the buffer layer has a thickness comprised between 10 and 200 nm;

the substrate is based on silicon and the buffer layer comprises an aluminium nitride AlN layer and moreover a gallium and aluminium nitride AlGaN layer on the aluminium nitride AlN layer;

the structure comprises a substrate based on sapphire $Al_2O_3$, silicon Si, silicon on insulator SOI, silicon carbide SiC, aluminium nitride AlN, zinc oxide ZnO or gallium arsenide GaAs.

BRIEF DESCRIPTION OF THE DRAWINGS

Other advantages and characteristics of the method according to the invention and the associated product will become clearer from the description that follows of several alternative embodiments, given as non-limiting examples, and from the appended drawings wherein.

In the different figures, the same references designate similar elements.

DETAILED DESCRIPTION OF THE INVENTION

The invention relates to the passivation of a semiconductor structure by means of a crystalline passivation layer covering the entire surface of a layer based on group III nitrides of said structure. This crystalline passivation layer is in epitaxial relation with the layer based on group III nitrides on which it is deposited. This crystalline passivation layer is deposited on said surface from silicon and nitrogen atoms, and has silicon and nitrogen atoms bound to the surface of the layer based on group III nitride and arranged in a periodical arrangement such that a diffraction image of said crystalline passivation layer obtained by grazing-incidence diffraction of electrons in the direction [1-100] comprises:

a central line (0, 0) and integer order lines (0, −1) and (0, 1), two fractional order diffraction lines (0, −⅓) and (0, −⅔) between the central line (0, 0) and the integer order line (0, −1), and two fractional order diffraction lines (0, ⅓) and (0, ⅔) between the central line (0, 0) and the integer order line (0, 1).

Such a diffraction image corresponds to a hexagonal periodical arrangement turned by 30° with respect to the lattice of the layer based on group III nitride and with a lattice parameter $\sqrt{3}$ times greater than the lattice parameter of the layer based on group III nitride.

The layer based on group III nitrides may be a thick layer (template) or self-supporting layer designated as bulk substrate, in which case it constitutes the semiconductor structure. The semiconductor structure based on group III nitride may thus be a thick layer of GaN, AlN etc., or a bulk substrate of GaN, AlN etc., or instead an epitaxied structure (or "epiwafer").

It may also be supported by a substrate and a buffer layer. The description that follows will be made with reference to this configuration. It may thus for example have a configuration of light emitting diode, of high electron mobility transistor (HEMT).

Figure 1:
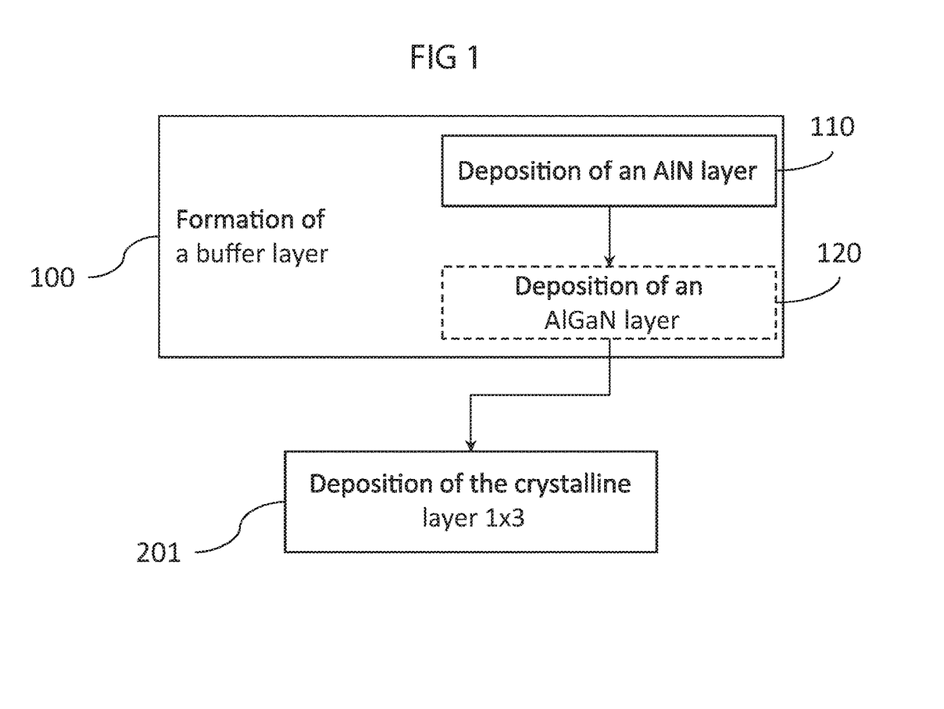
FIG. 1 illustrates an example of method for producing a semiconductor structure based on group III nitrides.

In FIG. 1 is illustrated an alternative embodiment of the method according to the invention. The method comprises the steps consisting of:
- forming 100 a buffer layer on a substrate, said layer comprising a layer based on group III nitrides,
- depositing 201 a crystalline passivation layer on the buffer layer.

Substrate

Figure 2:
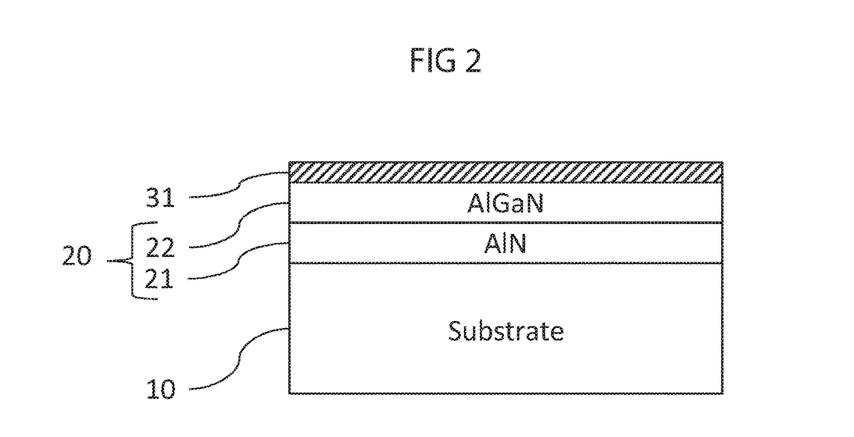
FIG. 2 schematically illustrates an example of product obtained by implementing the method illustrated in FIG. 1, FIGS. 3 and 4 illustrate two diffraction images in the crystallographic directions [1-100] and [1-210], respectively, of a crystalline passivation layer according to the invention.

To produce the semiconductor structure, a substrate 10 is used on which different deposition steps are implemented.

The substrate 10 used may be sapphire $Al_2O_3$, silicon Si, silicon carbide SiC, aluminium nitride AlN, or zinc oxide ZnO or gallium arsenide GaAs. In one embodiment, the substrate is silicon.

The use of a silicon substrate has numerous advantages compared to the use of a sapphire substrate; notably:
- a silicon substrate is cheaper than a sapphire substrate;
- the dimensions of silicon substrates (generally up to 12 inches, i.e. 30.48 cm) are greater than those of sapphire substrates (generally up to 6 inches, i.e. 15.24 cm); it is thus possible to produce a gallium nitride GaN layer of larger surface area using a silicon substrate;
- the different post-growth steps of production of components (polishing rear face, transfer front face, removal of the substrate, etc.) after the growth of the gallium nitride GaN layer are simpler and cheaper in the case of the use of a silicon substrate than in the case of a sapphire substrate.

Thus, the use of silicon substrates enables for example the production of light emitting diodes (LED) at low production cost, which may be particularly advantageous in the lighting field.

Figure 5:
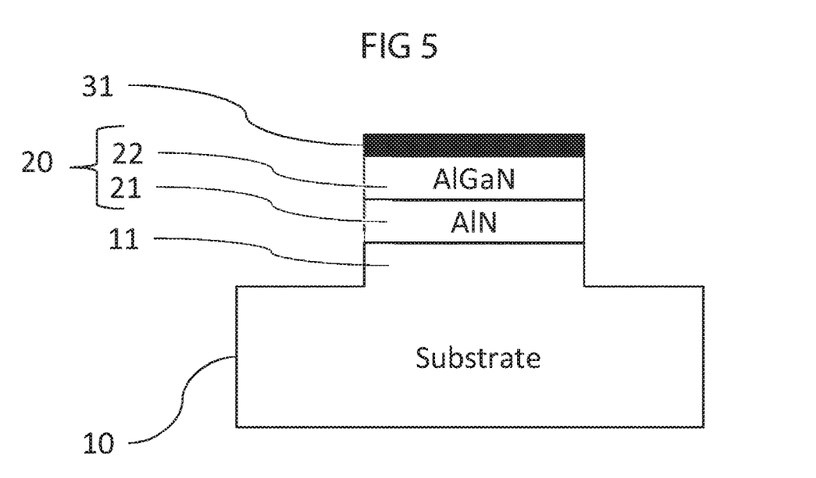
FIG. 5 illustrates a support having a mesa structure.
Figure 6:
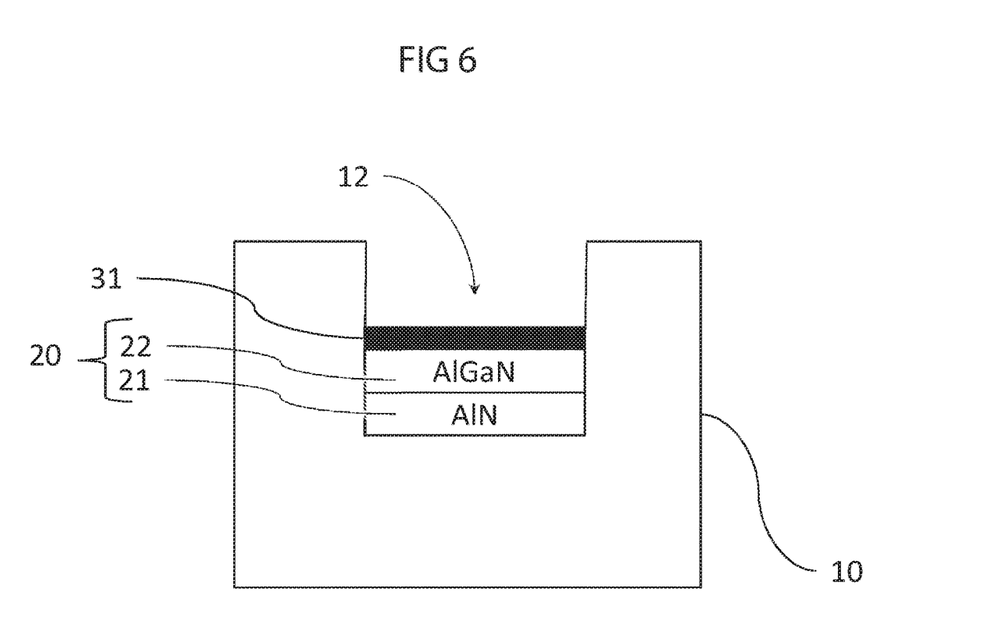
FIG. 6 illustrates a support having a box structure.

Advantageously, the substrate 10 may be a patterned substrate comprising a mesa structure 11 having the shape of a raised plateau (the size of which may vary from 10×10 μm to 400×400 μm) and obtained by etching of the surface of the substrate surrounding the plateau, as illustrated in FIG. 5, or instead a box structure, as represented in FIG. 6, in which the buffer layer 20 based on group III nitride, in this particular case made of AlN and AlGaN, and the passivation layer entirely covering it are situated in a recess 12 cut into the substrate 10. Another method for producing patterns, such as for example the partial masking of the surface by a mask made of dielectric materials, may be advantageously used.

The use of such a patterned substrate makes it possible to limit fissuring of the gallium nitride layer epitaxied on the substrate 10, and thus to increase the critical thickness of gallium nitride GaN that can be deposited on the substrate 10 without creating fissures.

For example, it is possible to produce a non-fissured gallium nitride GaN layer of 5 μm thickness using a substrate including a mesa structure of 200×200 μm whereas the use of a non-structured substrate only makes it possible to produce a non-fissured gallium nitride GaN layer of 1 μm thickness.

Formation of the Buffer Layer

The method comprises a step of formation 100 of a buffer layer 20, of which the upper layer then constitutes the layer based on group III nitrides on which will be deposited the crystalline passivation layer 31. This buffer layer may comprise a layer of aluminium nitride AlN, aluminium gallium nitride AlGaN, aluminium gallium boron nitride AlGaBN, a stack of AlN/AlGaN, a gradual AlGaN, zinc oxide ZnO, boron nitride BN or instead silicon carbide SiC. However, in all cases, the buffer layer has an upper layer based on group III nitrides, such as aluminium nitride AlN, aluminium gallium nitride AlGaN.

In the case of the present example, this step of formation 100 comprises the deposition 110 of an aluminium nitride AlN layer 21. The formation of a buffer layer 20 including an aluminium nitride AlN layer 21 makes it possible to improve the quality of the gallium nitride GaN layer deposited later.

For example, when the substrate 10 used is silicon Si, the direct growth of gallium nitride GaN on silicon Si is very difficult notably on account of the high chemical reactivity between gallium Ga and silicon Si at high temperature.

The formation of a buffer layer 20 including an aluminium nitride AlN layer 21 makes it possible to overcome these difficulties, and thus to improve the quality of the gallium nitride GaN layer epitaxied later.

The buffer layer 20 may have a thickness comprised between 10 nm and 500 nm, preferentially between 50 nm and 200 nm. A buffer layer with a thickness greater than 200 nm makes it possible to obtain a good crystalline quality of the buffer layer 20, and thus to improve that of the group III nitride layer epitaxied later.

The crystalline passivation layer according to the invention, which totally covers the buffer layer, makes it possible however to ensure a good crystalline quality of the group III nitride layer epitaxied later even if the crystalline quality of the buffer layer is not maximal. Consequently, it is not necessary that the buffer layer 20 reaches a thickness greater than 200 nm. Thus, preferably, the buffer layer 20 has a thickness comprised between 10 and 200 nm, or even between 50 and 100 nm.

The fact of limiting the thickness of the buffer layer 20 below 200 nm advantageously makes it possible to reduce the duration of the method, the growth time of an aluminium nitride AlN layer 21 being relatively long. Another advantage is the fact that with a not very thick buffer layer 20, which is entirely covered by a crystalline passivation layer, the problem of dislocations in this buffer layer resolved by the crystalline passivation layer is all the more rapidly resolved, which prevents dislocations from propagating and causing dislocations.

The step of formation 100 of the buffer layer 20 may also comprise an optional step of deposition 120 of an aluminium and gallium nitride AlGaN layer 22 on the aluminium nitride AlN layer 21. This makes it possible to obtain a complex buffer layer 20 of aluminium nitride AlN and aluminium and gallium nitride AlGaN. The aluminium and gallium nitride AlGaN layer 22 makes it possible to reduce the dislocation density of the layer on which the crystalline passivation layer is deposited.

Advantageously, the thickness of the buffer layer 20, and thus the sum of the thicknesses of the layers 21, 22 of aluminium nitride AlN and of aluminium and gallium nitride AlGaN may be comprised between 10 nm and 500 nm, and preferably between 50 and 200 nm, with for example the following distribution:
- 25-100 nm of aluminium nitride AlN,
- 25-400 nm of aluminium and gallium nitride AlGaN.

This makes it possible to reduce the duration of growth of the buffer layer while benefiting from the advantages relative to the deposition of aluminium nitride and aluminium and gallium nitride layers.

Preferably, the surface of the buffer layer, that is to say the surface of the layer based on group III nitrides, on which is going to be deposited the crystalline passivation layer, is formed as smooth as possible.

To this end, it is advantageous to carry out the surface treatment of the buffer layer 20 at a temperature less than 950° C. under a flow of silicon atoms and a flow of nitrogen atoms, for example molecules of ammonia $NH_3$, in a molecular beam epitaxy reactor. In so doing, the surface does not degrade and remains smooth.

Deposition of a Crystalline Passivation Layer

The method comprises a step of deposition 201 of a crystalline passivation layer 31 on the buffer layer 20. The crystalline passivation layer 31 is in epitaxial relation with the buffer layer 20.

This deposition of a crystalline passivation layer 31 is for example obtained by exposing the surface of the buffer layer 20 to a precursor containing silicon Si atoms. The precursor containing silicon atoms may for example be silane $SiH_4$, disilane $Si_2H_6$, or trimethylsilane $SiH(CH_3)_3$. The deposition may also be carried out by combining silicon atoms with a flow of nitrogen atoms obtained from for example ammonia molecules $NH_3$.

The step of deposition of the crystalline passivation layer 31 corresponds to a surface treatment which leads to a surface reconstruction of the atoms deposited on the surface of the buffer layer 20.

In fact, following the exposure of the surface of the buffer layer 20 to the silicon Si atoms and to the nitrogen atoms, the atoms bond to the surface of the buffer layer by creating a hexagonal periodical arrangement turned by 30° with respect to the lattice of the layer based on group III nitride on which the atoms are deposited and with a lattice parameter $\sqrt{3}$ greater than that of the layer based on group III nitride.

The formation of this surface reconstruction is measurable by electron diffraction techniques and it is possible to quantify its level of coverage of the surface by recording the intensity of the specific diffraction lines of this surface reconstruction. The diffraction of electrons is a technique used for the study of matter, which consists of bombarding a sample with electrons and observing the resulting diffraction figure.

An example of electron diffraction technique that may be used within the scope of the present invention for studying the structure of the crystalline layer during the deposition phase is reflection high energy electron diffraction (RHEED), which is a technique making it possible to determine the crystalline structure of the surface in an ultra-vacuum environment.

The RHEED technique notably makes it possible to determine the surface reconstruction, to measure the rate of growth and to assess qualitatively the flatness of the surface. A RHEED device consists of an electron gun which makes it possible to create a monokinetic beam of electrons of an energy of 10 to 50 keV focused on the surface. The wavelength associated with the electrons is of the order of 0.1 Å. The beam reaches the surface in grazing incidence with an angle of 1 to 2 degrees. In this configuration the interaction of the electrons with the surface is limited to several atomic planes. The electrons reflected and diffracted by the surface atoms are collected on a fluorescent screen, making it possible to visualise the corresponding diffraction pattern and this pattern may next be digitised using a CCD camera. The document "Reflection High Energy Electron Diffraction", by Ayahiko Ichimiya and Philip I. Cohen, Cambridge University Press, 2004, describes this technique.

Figure 3:
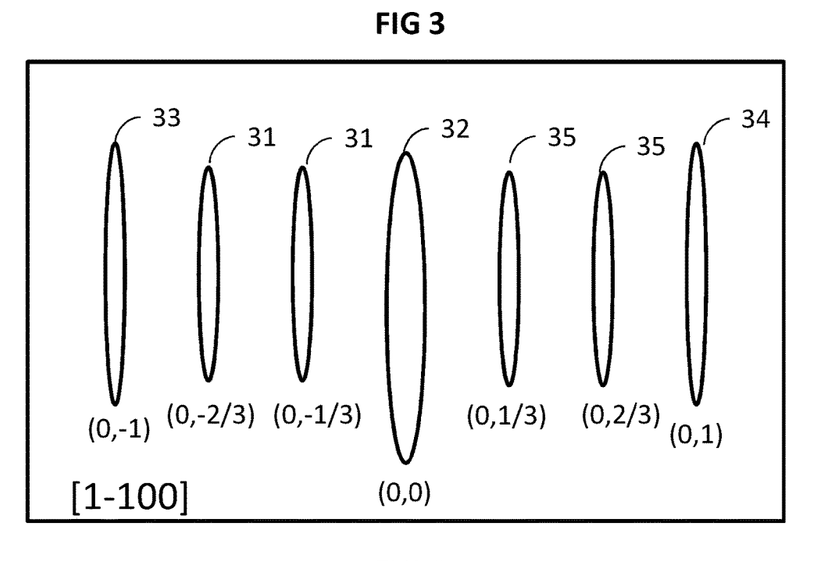
Figure 4:
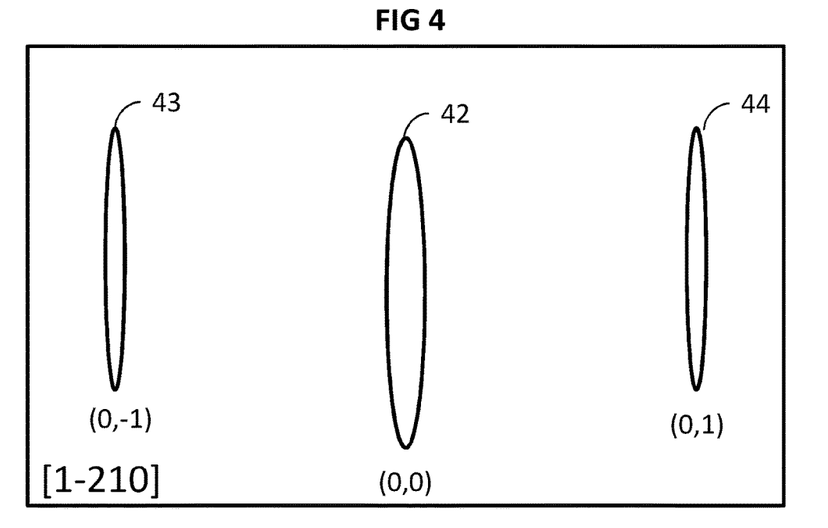

With reference to FIGS. 3 and 4, two diffraction images of the crystalline layer along the respective crystallographic directions [1-100] and [1-210] are illustrated.

In FIG. 4, the diffraction image of the crystalline layer in the direction [1-210] uniquely comprises integer order diffraction lines: a central line (0,0) 42 and two integer order lines (0, -1) 43 and (0, 1) 44 on either side of said central line 42. Thus there are no fractional order lines between the integer order lines (0,-1) and (0, 1) and the central line (0, 0). It is to be noted that the gap between the integer order diffraction lines is inversely proportional to the lattice parameter in the plane of the surface.

In FIG. 3 on the other hand, corresponding to the diffraction image of the crystalline layer in the direction [1-100], the presence of a surface reconstruction leads to the presence of additional fractional order lines, that is to say non-integer order lines, to be specific ⅓ lines characteristic of a reconstruction designated 1×3. The diffraction image of the crystalline layer in the direction [1-100] thus comprises:
a central line (0, 0) and integer order lines (0, -1) and (0, 1),
two fractional order diffraction lines 31, designated (0, -⅓) and (0, -⅔) between the lines (0, 0) 32 and (0, -1) 33, and
two fractional order diffraction lines 35, designated (0, ⅓) and (0, ⅔) between the lines (0, 0) 32 and (0, 1) 34.

Consequently, the diffraction image in the direction [1-210] only has one space between the integer order lines, whereas the diffraction image in the direction [1-100] has three spaces between the integer order lines, which is why this crystalline layer is denoted 1×3.

Thus, and unlike methods of the prior art comprising a step of deposition of a nanoporous SiNx layer of which the exact structure and composition are unknown, the method according to the invention proposes the deposition of a crystalline passivation layer designated 1×3 of perfectly defined structure and composition, and of which the pore density is preferably the lowest possible, or even substantially zero.

Hence, in methods of the prior art, it is sought to avoid a total coverage level of the surface of the layer based on group III nitride. Yet, the inventors have discovered that the dislocation density is minimal when the crystalline layer covers the entire surface of the layer based on group III nitride.

The deposition of the crystalline passivation layer 1×3 induces a passivation of the surface of the buffer layer 20. This passivation enables the buffer layer 20 to be made inert with regard to exposure to air and thus to prevent any oxidation reaction. Furthermore, an exposure to air of a semiconductor structure having such a crystalline passivation layer 1×3 on its upper layer based on group III nitride does not alter the surface reconstruction 1×3 of said crystalline passivation layer 1×3.

In order that the passivation by the crystalline passivation layer 31 enables a good protection of the layer based on group III nitride at the surface of which it is deposited, the crystalline passivation layer 31 covers the entire surface of this layer based on group III nitride in a continuous manner, that is to say in the absence of holes or openings, unlike what is sought by those skilled in the art during the production of a nanoporous SiNx layer.

In this respect, it is to be noted that the crystalline passivation layer 31 has a very low thickness, of the order of a monolayer of silicon atoms, i.e. of the order of 2 Å to 3 Å. Hence, in order to conserve the crystalline character of the passivation layer, the thickness thereof is preferably less than 6 Å.

Obtaining a Support for the Growth of Group III Nitrides

At the end of the step of deposition 201 of the crystalline passivation layer 31, a support is obtained for the growth of a semiconductor structure based on group III nitrides, such as a gallium nitride GaN layer.

Growth Techniques Used

The step of deposition of the crystalline passivation layer 31 may consist of an ultra-vacuum deposition.

Advantageously, the steps of:
formation of the buffer layer 20, and/or
deposition of the crystalline passivation layer 31 on the buffer layer 20, may be carried out by molecular beam epitaxy (MBE), which is carried out in an ultra-vacuum environment.

It is also possible that the step of deposition of the crystalline passivation layer 31 consists of a vapour phase deposition, more precisely a deposition by metal organic vapour phase epitaxy (MOVPE).

The fact of forming the buffer layer by molecular beam epitaxy—and thus in an ultra-vacuum environment—has numerous advantages compared to techniques of formation of the buffer layer by metal organic vapour phase epitaxy.

Notably, the formation of the buffer layer 20 by molecular beam epitaxy enables:
on the one hand, to eliminate any trace of reactive gas in the environment of the substrate, and thus to limit the risks of parasitic nitridation reactions of the surface of the substrate,
on the other hand, to limit fouling of the growth reactor and thus to improve the production yield by reducing the frequency of reactor maintenance operations.

Moreover, the formation of the buffer layer 20 by molecular beam epitaxy makes it possible to obtain a surface of the layer based on group III nitrides that is very smooth, thus improving the formation of the crystalline passivation layer 31.

Furthermore, the use of an ultra-vacuum in MBE also makes it possible to carry out an in-situ monitoring—for example by electron diffraction—of the deposition of the crystalline layer. This enables a precise monitoring of the step of deposition of the crystalline layer so as to stop this step when the thickness of the crystalline layer totally covers the surface.

Thus, the method may comprise a step of measuring the coverage level of the crystalline passivation layer 31 by grazing-incidence diffraction of electrons in the direction [1-100] during the step of deposition of the crystalline passivation layer 31 so as to obtain a diffraction image of said crystalline passivation layer, wherein the duration of the step of deposition of the crystalline passivation layer is linked to the intensity of at least one diffraction line of a diffraction image of the crystalline passivation layer obtained by electron diffraction in the crystallographic direction [1-100].

As indicated previously, the diffraction image of the crystalline passivation layer 31 in the direction [1-100] then comprises:
a central line (0, 0) and integer order lines (0, −1) and (0, 1),
two fractional order diffraction lines (0, −$\frac{1}{3}$) and (0, −$\frac{2}{3}$) between the central line (0, 0) and the integer order line (0, −1), and
two fractional order diffraction lines (0, $\frac{1}{3}$) and (0, $\frac{2}{3}$) between the central line (0, 0) and the integer order line (0, 1).

Preferably, the step of deposition of the crystalline passivation layer 31 is interrupted when the luminous intensity of the fractional order intermediate lines of the diffraction image (in the crystallographic direction [1-100]) is maximal, which corresponds to a complete coverage level of the surface of the layer based on group III nitride by the crystalline passivation layer 31.

This maximum of intensity is easily identifiable. In fact, by using a CCD camera, it suffices to record the intensity profile of one of the fractional order diffraction lines in the direction [1-100] as a function of the deposition time of the passivation layer. Firstly, the fractional order diffraction line appears then its intensity increases during the deposition, to reach a plateau before secondly decreasing and finishing by disappearing. The maximum of intensity is thus detectable by the stability of this intensity, which can last several minutes.

Figure 7:
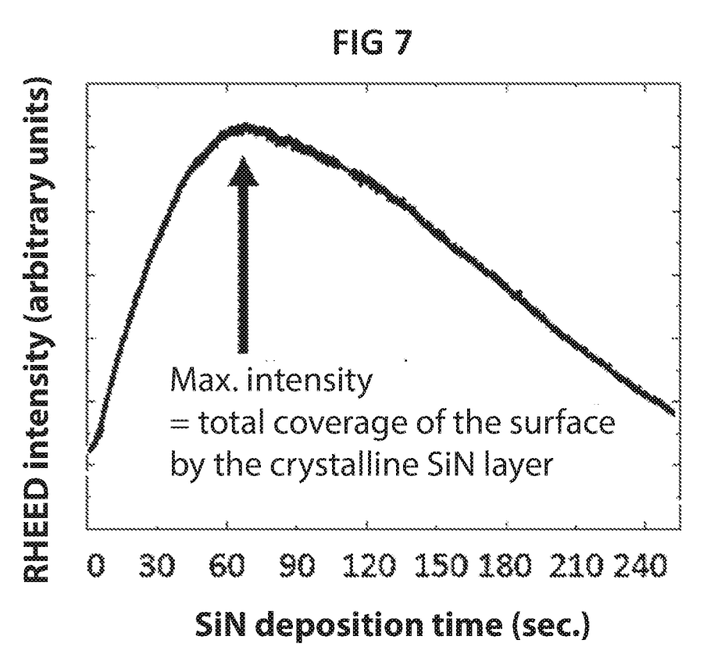
FIG. 7 illustrates a curve representative of the change over time of the intensity of the fractional order lines of a diffraction image during the deposition of a crystalline layer.

FIG. 7 thus shows an example of curve representative of the change over time of the intensity of a fractional order line in a diffraction image during the deposition of a crystalline layer. It may be noted that this intensity firstly begins by increasing between 0 and 60 seconds, then decreases after 90 seconds. The level of a maximum of intensity is thus reached between 60 seconds and 90 seconds.

In the deposition conditions of FIG. 7, it is thus possible to interrupt the step of deposition of the crystalline passivation layer at an instant corresponding to a maximum of luminous intensity of the fractional order intermediate lines of a diffraction image in the crystallographic direction [1-100] by interrupting the deposition between 60 and 90 seconds after its start.

A semiconductor structure thus passivated may then be exposed to air, stored or handled without degradation of its surface and while conserving its specific properties leading to a three-dimensional mode of growth. A later growth of a group III nitride layer may be taken up easily on such a passivation layer. Such a structure is qualified as "epi-ready" to signify that an epitaxy may be undertaken on said structure without having to chemically prepare the surface beforehand.

Example of Production Method

An example of method according to the invention will now be described.

The silicon substrate used has a crystallographic orientation (111).

A buffer aluminium nitride AlN layer is formed by molecular beam epitaxy on the silicon substrate. The formation of the buffer layer is interrupted when the thickness thereof is comprised between 10 and 200 nm.

The step of deposition of the crystalline layer 1×3 is then carried out. A surface treatment of the buffer layer by molecular beam epitaxy is implemented using silicon atoms and molecules of ammonia $NH_3$. This surface treatment leads to the formation of a new well-defined epi-ready crystalline structure, measurable and identifiable by electron diffraction.

During the deposition of the crystalline layer, the surface is observed by an electron diffraction technique consisting of sending at grazing incidence a beam of monokinetic electrons onto the crystalline layer in the course of formation in order to observe the resulting diffraction figure (in the crystallographic direction [1-100]).

The ordered periodic structure of the crystalline layer 1×3 makes it possible to diffract electrons and thus to obtain a specific diffraction image.

The duration of the step of deposition of the crystalline layer is a function of the intensity of the fractional order diffraction lines observed on the diffraction image.

In particular, the step of deposition of the crystalline layer is interrupted when the intensity of at least one of the diffraction lines observed in the diffraction figure is maximal, which is detectable by the stability of this intensity.

A semiconductor structure based on group III nitride is then obtained comprising a buffer layer based on group III nitride of which the entire surface is entirely covered with a crystalline passivation layer comprising silicon and nitrogen atoms bound to the surface and arranged in a periodical arrangement such that the diffraction image of the crystalline layer in the direction [1-100] comprises:
- a central line (0, 0) and integer order lines (0, −1) and (0, 1),
- two fractional order diffraction lines (0, −⅓) and (0, −⅔) between the central line (0, 0) and the integer order line (0, −1), and
- two fractional order diffraction lines (0, ⅓) and (0, ⅔) between the central line (0, 0) and the integer order line (0, 1).

This corresponds to a hexagonal periodical arrangement turned by 30° with respect to the lattice of the layer based on group III nitride and with a lattice parameter times greater than the lattice parameter of said layer based on group III nitride.

Those skilled in the art will have understood that numerous modifications may be made to the method described above without materially going beyond the new teachings described herein.

For example, the steps consisting of forming the buffer layer and depositing the crystalline layer may be carried out by MOVPE. Furthermore, the step of growth of the semiconductor structure based on group III nitrides may be carried out by MBE.

It is thus obvious that the examples that have been given are only particular illustrations and are in no way limiting.

The invention claimed is:

1. A passivated semiconductor structure forming support for a structure based on group III nitrides, said semiconductor structure comprising a layer based on group III nitrides of which the entire surface is entirely covered by a crystalline passivation layer having a thickness that maximizes the intensity of at least one of the diffraction lines observed in a diffraction image of said crystalline passivation layer, wherein said crystalline passivation layer is constituted of silicon and nitrogen atoms bound to the surface and having a triple periodicity of silicon atoms in the crystallographic direction [1-100] such that said diffraction image obtained by grazing-incidence diffraction of electrons in the crystalline direction [1-100] comprises:
- a central line (0, 0) and integer order lines (0, −1) and (0, 1),
- two fractional order diffraction lines (0, −⅓) and (0, −⅔) between the central line (0, 0) and the integer order line (0, −1), and
- two fractional order diffraction lines (0, ⅓) and (0, ⅔) between the central line (0, 0) and the integer order line (0, 1).

2. The structure according to claim 1, wherein the crystalline layer has a single periodicity in a crystallographic direction [1-210] such that a diffraction image of said crystalline passivation layer obtained by grazing-incidence diffraction of electrons in the crystalline direction [1-210] comprises a central line (0, 0) and integer order lines (0, −1) and (0, 1) without fractional order lines between them.

3. The structure according to claim 1, wherein said crystalline passivation layer consisting of silicon atoms bound to the surface of the layer based on group III nitrides and arranged in a hexagonal periodical arrangement turned by 30° with respect to a lattice of the layer based on group III nitride and with a lattice parameter √3 times greater than a lattice parameter of the lattice of the layer based on group III nitride.

4. The structure according to claim 1, wherein the crystalline passivation layer has a thickness less than 6 Å.

5. The structure according to claim 1, wherein the layer based on group III nitrides is a self-supporting layer.

6. The structure according to claim 1, comprising a substrate and a buffer layer on the substrate, the buffer layer constituting the layer based on group III nitrides of which the entire surface is continuously covered by a crystalline passivation layer.

7. The structure according to claim 6, wherein the buffer layer has a thickness comprised between 10 and 200 nm.

8. The structure according to claim 6, wherein the substrate is based on silicon and the buffer layer comprises an aluminium nitride AlN layer and further a gallium and aluminium nitride AlGaN layer on the aluminium nitride AlN layer.

9. The structure according to claim 1, comprising a substrate and wherein the substrate is based on sapphire, silicon Si, silicon on insulator SOI, silicon carbide SiC, aluminium nitride AlN, zinc oxide ZnO or gallium arsenide GaAs.

* * * * *